US006882177B1

(12) United States Patent
Reddy et al.

(10) Patent No.: US 6,882,177 B1
(45) Date of Patent: Apr. 19, 2005

(54) TRISTATE STRUCTURES FOR PROGRAMMABLE LOGIC DEVICES

(75) Inventors: Srinivas Reddy, Santa Clara, CA (US); Richard G. Cliff, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 134 days.

(21) Appl. No.: 09/832,685

(22) Filed: Apr. 10, 2001

Related U.S. Application Data

(60) Continuation of application No. 09/169,207, filed on Oct. 9, 1998, now Pat. No. 6,239,613, which is a division of application No. 08/587,875, filed on Jan. 10, 1996, now Pat. No. 5,894,228.

(51) Int. Cl.[7] .................................................. G06F 7/38
(52) U.S. Cl. .............................. 326/45; 326/57; 326/44
(58) Field of Search ........................... 326/56, 57, 58, 326/40, 44, 45, 49, 50

(56) References Cited

U.S. PATENT DOCUMENTS

| | | | |
|---|---|---|---|
| 4,609,986 A | 9/1986 | Hartmann et al. | |
| 4,617,479 A | 10/1986 | Hartmann et al. | |
| 4,677,318 A | 6/1987 | Veenstra | |
| 4,686,396 A | * 8/1987 | Law et al. ................... | 307/473 |
| 4,713,792 A | 12/1987 | Hartmann et al. | |
| 4,871,930 A | 10/1989 | Wong et al. | |
| 4,899,067 A | 2/1990 | So et al. | |
| 4,912,342 A | 3/1990 | Wong et al. | |
| 5,121,006 A | 6/1992 | Pedersen | |
| 5,144,166 A | 9/1992 | Camarota et al. | |
| 5,185,706 A | 2/1993 | Agrawal et al. | |
| 5,208,491 A | 5/1993 | Ebeling et al. | |
| 5,241,224 A | 8/1993 | Pedersen et al. | |
| 5,260,610 A | 11/1993 | Pedersen et al. | |
| 5,260,611 A | 11/1993 | Cliff et al. | |
| 5,268,598 A | 12/1993 | Pedersen et al. | |
| 5,329,180 A | 7/1994 | Popli et al. | |
| 5,343,406 A | 8/1994 | Freeman et al. | |
| 5,350,954 A | 9/1994 | Patel | |
| 5,355,035 A | 10/1994 | Vora et al. | |
| 5,365,125 A | * 11/1994 | Goetting et al. .............. | 326/39 |
| 5,406,133 A | 4/1995 | Vora et al. | |
| 5,444,394 A | 8/1995 | Watson et al. | |
| 5,453,706 A | * 9/1995 | Yee ............................. | 326/93 |
| 5,497,108 A | 3/1996 | Menon et al. | |
| 5,504,440 A | 4/1996 | Sasaki | |
| 5,506,517 A | 4/1996 | Tsui et al. | |
| 5,548,229 A | 8/1996 | Segawa et al. | |
| 5,581,199 A | 12/1996 | Pierce et al. | |
| 5,614,840 A | 3/1997 | McClintock et al. | |
| 5,614,844 A | 3/1997 | Sasaki et al. | |
| 5,652,904 A | 7/1997 | Trimberger | |
| 5,682,107 A | * 10/1997 | Tavana et al. ................ | 326/41 |
| 5,705,938 A | 1/1998 | Kean | |
| 6,002,268 A | 12/1999 | Sasaki et al. | |
| 6,025,736 A | 2/2000 | Vora et al. | |
| 6,100,715 A | * 8/2000 | Agrawal et al. .............. | 326/39 |

OTHER PUBLICATIONS

Scarpero, Jr., Field–Effect Transistor Bidirectional Driver Control Circuit, IBM TDB, vol. 16, No. 8, pp. 2442–2443, Jan. 1974.

Rhyne, Fundamentals of Digital Systems Design, N. J., pp. 70–71, 1973.

(Continued)

Primary Examiner—Daniel D. Chang
(74) Attorney, Agent, or Firm—Townsend and Townsend and Crew LLP

(57) ABSTRACT

A programmable logic device architecture including tristate structures. The programmable logic device architecture provides tristate structures which may be logically or programmably controlled, or both. Through these tristate structures, the logic elements may be coupled to the programmable interconnect, where they may be coupled with other logic elements of the programmable logic device. Using these tristate structures, the signal pathways of the architecture may be dynamically reconfigured.

20 Claims, 7 Drawing Sheets

OTHER PUBLICATIONS

Anonymous, Tri–State Double inverter Buffer, Research Disclosure, p. 30511, Sep. 1989.

Xilinx Corp., The Programmable Logic Data Book, "XC4000, XC4000A, XC4000H, Logic Cell Array Families," pp.2–7 to 2–46 (1994).

Xilinx Corp., The Programmable Logic Data Book, "XC3000, XC3000A, XC3000L, XC3100, XC3100A, Logic Cell Array Families," pp. 2–105 to 2–124 (1994).

Xilinx Corp., The Programmable Logic Data Book, "XC3000, XC3000A, XC3000L, XC3100, XC3100A, Logic Cell Array Families," pp. 2–105 to 2–152 (1994).

Altera Data Book, Altera Classic, Programmable Logic Device Family, pp. 235–244, 08/93.

Altera Data Book, Max 5000 Programmable Logic Device Family, pp. 149–160, 08/93.

Altera Data Book, Max 7000 Programmable Logic Cell Device Family, pp. 69–81, 08/93.

Altera Data Book, Flex 8000 Programmable Logic Device Family, pp. 29–47, 08/93.

Altera Data Book, Introduction, pp. 3–16, 08/93.

* cited by examiner-

TRISTATE STRUCTURES FOR PROGRAMMABLE LOGIC DEVICES

CROSS-REFERENCES TO RELATED APPLICATIONS

This is a continuation application of U.S. patent application Ser. No. 09/169,207, filed Oct. 9, 1998, now U.S. Pat. No. 6,239,613, which is a divisional application of U.S. patent application Ser. No. 08/587,875, filed Jan. 10, 1996, issued as U.S. Pat. No. 5,894,228 on Apr. 13, 1999, all of which are incorporated by reference.

BACKGROUND OF THE INVENTION

The present invention relates to the field of programmable logic integrated circuits. More specifically, the present invention provides an enhanced programmable logic architecture, improving upon the composition, configuration, and arrangements of logic array blocks (LABs) and logic elements (LEs) and also the interconnections between these logic array blocks and logic elements.

Programmable Logic Devices (PLDs) are well known to those in the electronic art. Such programmable logic devices are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, and MAX® 5000, MAX® 7000, and FLEX® 8000 EPLDs made by Altera Corporation.

PLDs are generally known in which many LABs are provided in a two-dimensional array. Further, PLDs have an array of intersecting signal conductors for programmably selecting and conducting logic signals to, from, and between the LABs. LABs contain a number of individual programmable logic elements (LEs) which provide relatively elementary logic functions such as NAND, NOR, and exclusive OR.

Resulting from the continued scaling and shrinking of semiconductor device geometries which are used to form integrated circuits (also known as "chips"), integrated circuits have progressively become smaller and denser. For programmable logic, it becomes possible to put greater numbers of programmable logic elements onto one integrated circuit. Furthermore, as the number of elements increases, it becomes increasingly important to improve the techniques and architectures used for interconnecting the elements and routing signals between the logic blocks.

While such devices have met with substantial success, such devices also meet with certain limitations, especially in situations in which the provision of more complex logic modules and additional or alternative types of interconnections between the logic modules would have benefits sufficient to justify the additional circuitry and programming complexity. There is also a continuing demand for logic devices with larger capacity. This produces a need to implement logic functions more efficiently, with better performance, and to make better use of the portion of the device which is devoted to interconnecting individual logic modules.

As can be seen, an improved programmable logic device architecture is needed, especially a programmable logic architecture which provides for additional logical resources such as tristate structures for improving the interconnection resources between the logic elements.

BRIEF SUMMARY OF THE INVENTION

The present invention is a programmable logic architecture. The architecture provides for the implementation of tristate structures in programmable logic devices.

In one embodiment of the present invention, a plurality of logic elements are coupled through tristate switches to a tristate bus. From the tristate bus, the signals may be coupled through tristate drivers to a global interconnect structure, where the signals may be programmably coupled to LABs and LEs. OE generation circuits control the operation of the tristate switches. Logical signals from LABs and LEs may be programmably coupled through the global interconnect structure to the OE generation circuits to control whether the tristate switches are enabled or disabled. For example, LEs and LABs may logically control the tristate switches by coupling through tristate drivers and the global interconnect structure to the OE generation circuits. The enabled and disabled states of the tristate switches may also be programmably controlled by way of programmable cells.

In another embodiment of the present invention, the logic elements are coupled through tristate drivers to the global interconnect. The tristate drivers are controlled by a tristate control, which may be integrated into the logic of a LAB. From the tristate control, the tristate drivers may be logically controlled by signals on the programmable and global interconnect. Furthermore, the tristate drivers may also be programmably controlled by way of programmable cells. A plurality of tristate drivers may be coupled to share the same global interconnect line.

The tristate driver of the present invention may buffer and drive an input signal to an output line. This tristate driver may provide sufficient drive capability for driving a programmable interconnect conductor, which may be relatively heavily loaded. The tristate driver may be programmably and logically controlled. More specifically, the tristate driver may be programmably disabled, where its output will be tristated regardless of the states of logical inputs. When programmably enabled, the tristate driver output will be tristated or enabled depending on the states of the logical inputs. When logically and programmably enabled, the input line will be driven to the output line.

The architecture of the present invention provides greater utilization and flexibility in using the programmable and global interconnect structures of the programmable logic device. The architecture also provides greater utilization and flexibility in using the logic elements and other programmable resources. Furthermore, the programmable logic functions in this architecture may be dynamically and logically reconfigured, without the need to reprogram programmable cells. Further, the architecture of the present invention provides better performance and operating characteristics, including improved transient response.

The tristate structures of the present invention are useful for communication between multiple blocks of logic which share a common bus. More specifically, in an embodiment, the present invention includes: logic blocks which need to communicate with one another; tristate devices which drive a common tristate bus; a common signal bus, which may or may not be part of the tristate bus, that facilitates communication between the logic blocks; logic to control the enabling and disabling of the tristate devices; and, a signal path for coupling the tristate bus to the signal bus.

Other objects, features, and advantages of the present invention will become apparent upon consideration of the following detailed description and the accompanying drawings, in which like reference designations represent like features throughout the figures.

DESCRIPTION OF THE SPECIFIC EMBODIMENTS

Figure 1:
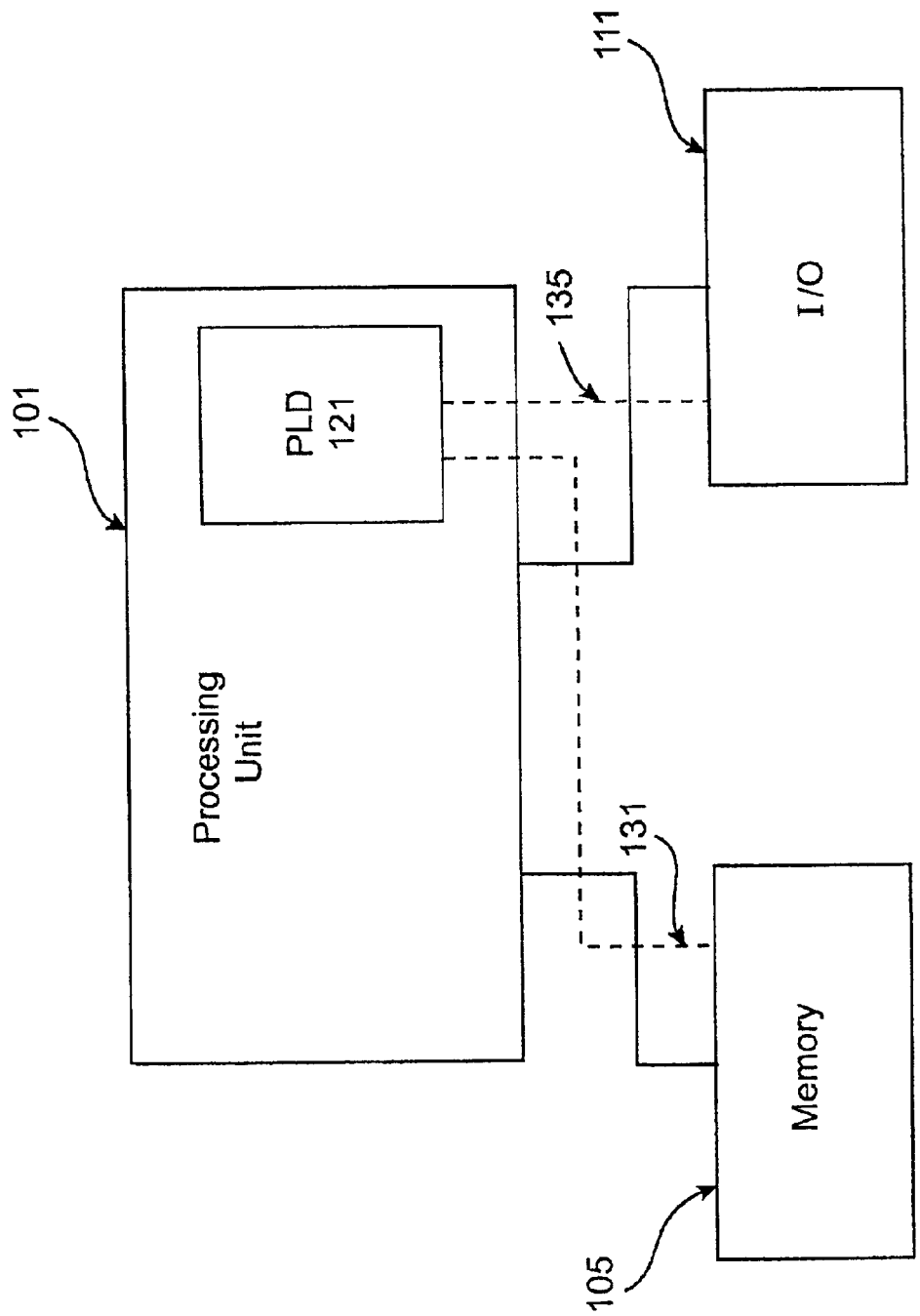
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD may serve many different purposes within the system in FIG. 1. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 1 may embody a plurality of PLDs 121, each performing different system functions.

The system shown in FIG. 1 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 1, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

Figure 2:
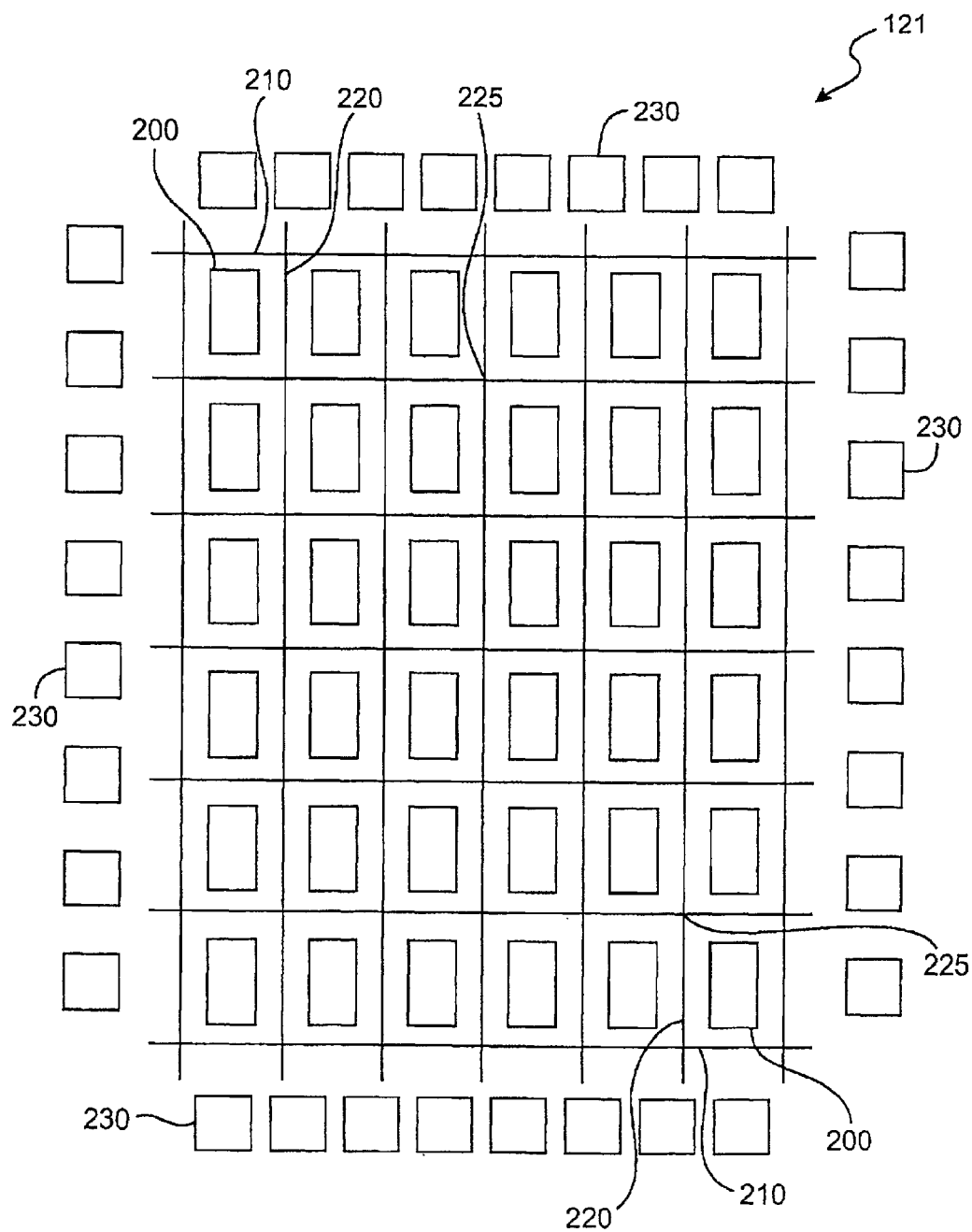
FIG. 2 is a block diagram showing the overall architecture of a programmable logic device.

FIG. 2 is a simplified block diagram of the overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than the PLD 121 shown in FIG. 2. Some PLDs may even contain a single LAB. However, generally in the future, as technology advances and improves, programmable logic devices with even greater numbers of logic array blocks will undoubtedly be created.

Furthermore, LABs 200 need not be organized in a square or rectangular matrix. While a rectangular or square array is generally an efficient layout structure, any arrangement of LABs inside the PLD may be conceived. For example, the array may be organized in a five-by-seven or a twenty-by-seventy matrix of LABs. Furthermore, in some circumstances, some number of LABs may be replaced by different programmable structures.

LAB 200 has inputs and outputs (not shown) which may or may not be programmably connected to a global interconnect structure, comprising an array of global horizontal intercon-nects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 (also sometimes referred to as "crosspoints") of these conductors. In some embodiments, intersection 225 may have programmable drivers for selecting the signal from a conductor in one direction and buffer the signal and drive it onto one of the alternate conductors in the same or different direction. Furthermore, in some embodiments, programmable drivers may be internal with LABs 200.

Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200.

In other embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

GHs 210 and GVs 220 may be organized to provide more specific, and less generalized, types of interconnections. This approach may provide sufficient resources for implementing most logical functions while at the same time, minimizing the amount of unused resources. For example, GHs 210 may directly programmably couple to the inputs of LABs 200. And, GVs 220 may not directly programmably couple to the inputs of LABs 200. However, GVs 220 may programmably couple through GHs 210 to the inputs of LABs 200. Furthermore, outputs from LABs 200 may directly programmably couple to GVs 220. From GVs 220, these outputs may be programmably coupled through GHs 210 to the inputs of one or more LABs 200.

The global interconnect may contain long and segmented conductors. Long conductors run the entire length or width of PLD 121. In particular, long conductors may programmably couple LABs along a length or width of PLD 121. Segmented conductors are for shorter length interconnections. For example, segmented conductors may include double lines for interconnections between two LABs 200. Other segmented conductors include, among other, triple lines, quadruple lines, quintuple lines, sextuple lines, and other similar interconnection resources. Furthermore, at intersections 225, segmented conductors may be programmably coupled (or programmably uncoupled) to other long or segmented conductors, in the same or different direction. Intersection 225 may sometimes be referred to as a "switch box." As an example, a double line may be programmably coupled to other double, long, or segmented lines, in the same or different direction, at intersections 225.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

An input driver buffers a signal received on a external pin and drives this signal onto one of the conductors inside the integrated circuit; then, this signal may be coupled to the desired internal circuits and LABs 200. An output driver buffers a signal received on an internal conductor, such as GHs 210 and GVs 220, to drive the signal out onto the external pin of the device. This makes the signal available to the "outside world."

An output driver may have additional characteristics. Among these are "tristate," "open drain," and "open source" features. A tristateable output driver may be enabled and disabled by a control signal. When enabled, a tristate output driver drives a data signal onto the external pin with a low impedance. When disabled, this output buffer does not drive the data signal out to the external pin, but the output buffer assumes a high-impedance state. In the high-impedance state, the tristate output driver has no effect on the signal level of the external pin. A tristateable output buffer may be used for a bidirectional input-output bus. An open-drain output driver behaves as follows: When the input data is a logic high, the output buffer assumes a high impedance state. When the input data input is a logic low, the output buffer drives out a logic low at low impedance. An open-source output driver behaves similarly: When the input data is a logic high, the buffer drives the external pin to a logic high at low impedance. When the input data is a logic low, the buffer assumes a high-impedance state.

An external pin may be coupled to both an input buffer and an output buffer. This type of pin is sometimes referred to as an input-output pin. In other embodiments of the present invention, a PLD may have dedicated input drivers and dedicated output driver; as well as special "fast" input drivers and the like.

Like LABs 200, input-output drivers 230 are programmably connectable to adjacent GH 210 and GV 220 conductors. Using GH 210 and GV 220 conductors, input-output drivers 230 are programmably connectable to any LAB 200. Input-output drivers 230 facilitate the transfer of data between LABs 200 and external, off-chip circuitry. For example, off-chip logic signals from other chips may be coupled through input-output drivers 230 to drive one or more LABs 200. Based on these off-chip inputs and the logical functions programmed into LABs 200, LABs 200 will generate output signals that are coupled through the global interconnect to input-output drivers 230 for interfacing with off-chip circuitry.

Figure 3:
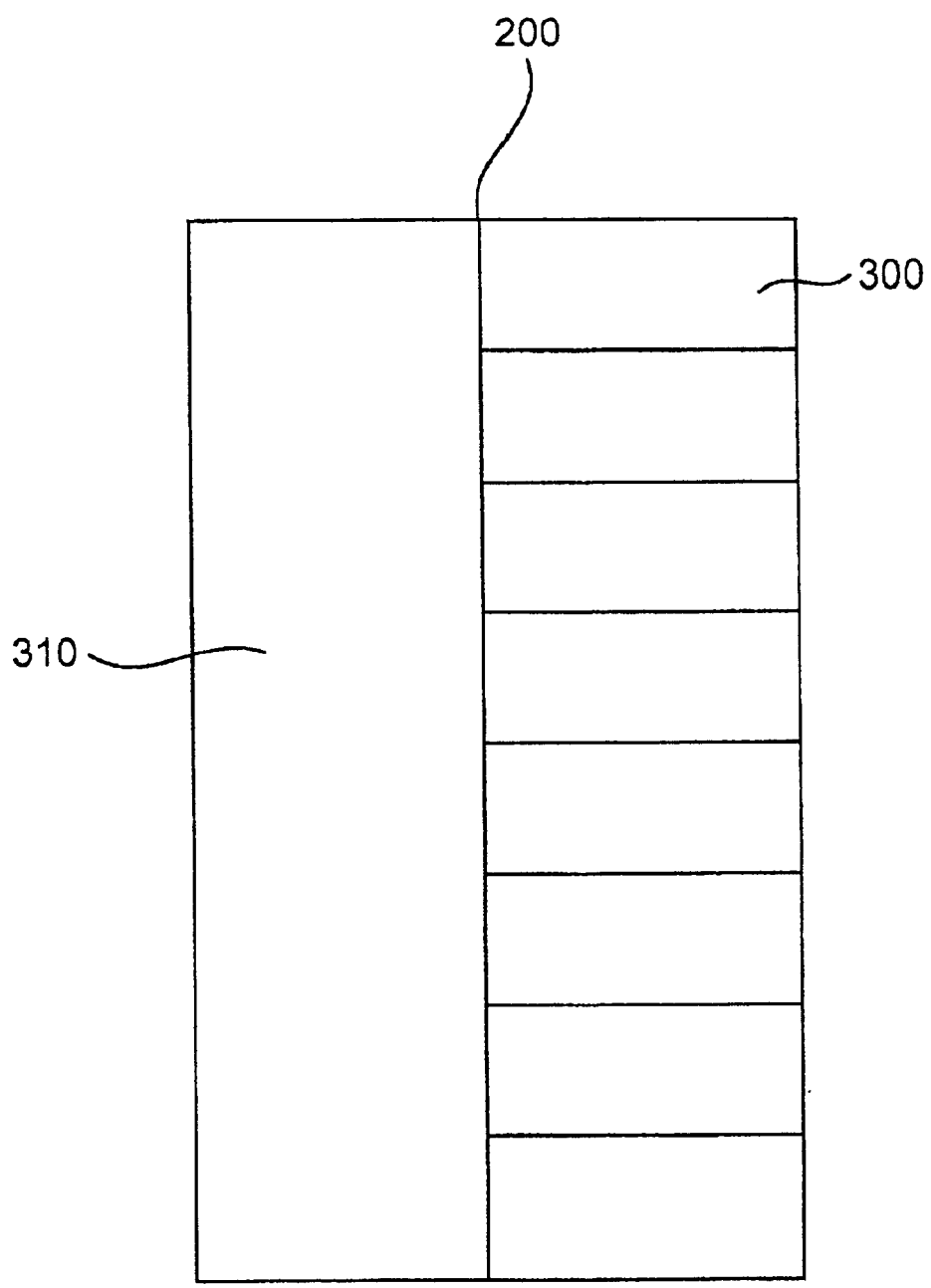
FIG. 3 is a simplified block diagram of a logic array block (LAB) of a programmable logic device.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has common inputs, but separate outputs and control signals. In some embodiments, LAB 200 includes carry chains.

A general overview of an LE is presented here, sufficient to provide a basic understanding of LAB 200. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

Figure 4:
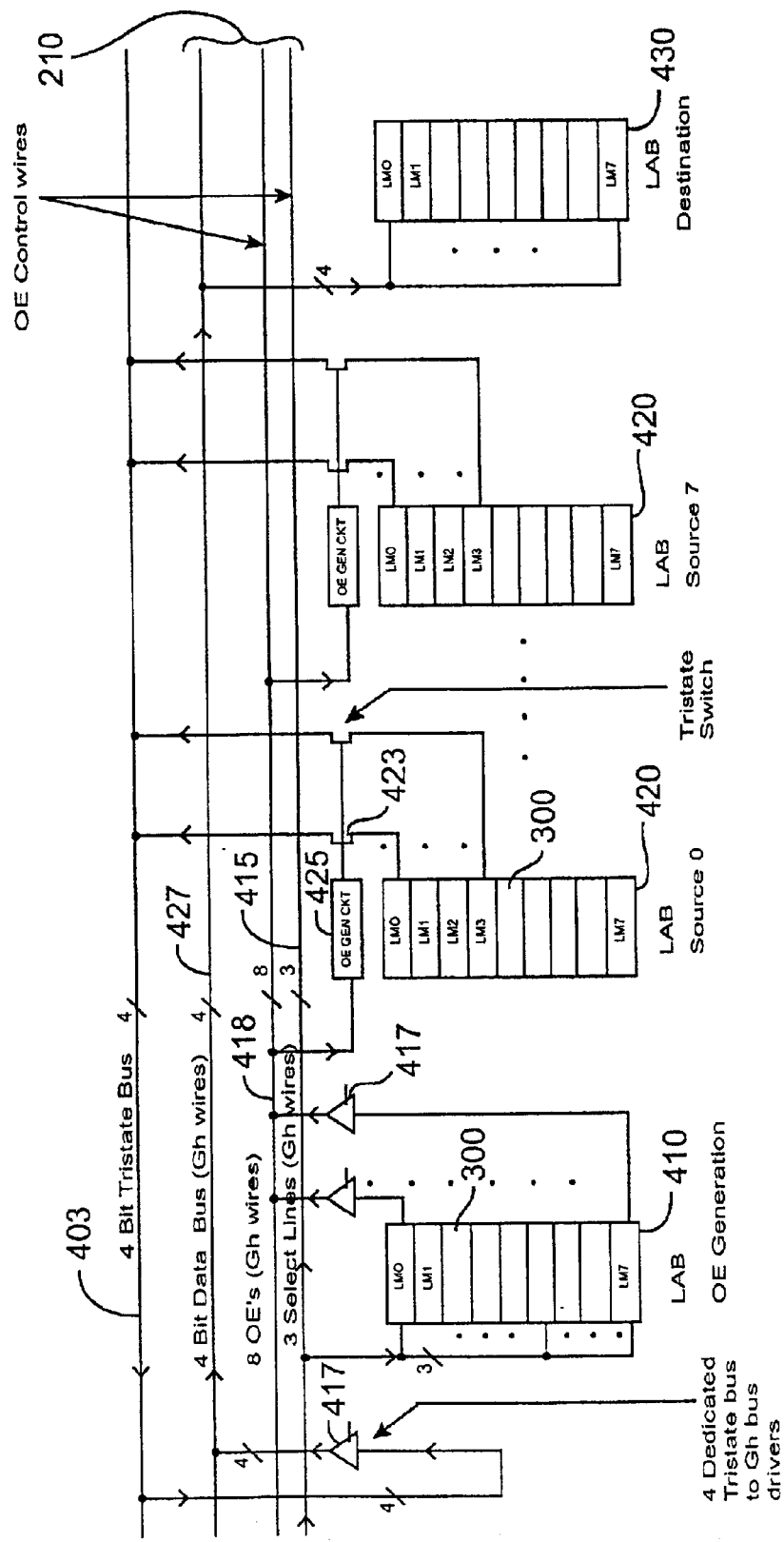
FIG. 4 is a more detailed block diagram of a tristate architecture of the present invention.

FIG. 4 is a block diagram of an embodiment of the tristate architecture of the present invention. The diagram illustrates the invention as applied to a row of LABs. In this embodiment, GHs may be directly programmably coupled to the inputs of the LABs. GVs may not be directly programmably coupled to the inputs of the LABs. However, GVs may be programmably coupled through the GHs to the inputs of the LABs. The architecture of the present invention may also be similarly applied to a column of LABs.

The particular embodiment shown in FIG. 4 is for purposes of illustrating the present invention. The numbers of the particular elements, as well as the interconnections for these elements, may vary depending on the specific implementation of the present invention. For example, even though a specific number of LABs are shown, there may be any number of LABs in a row of the present invention. There may be various numbers of LEs within the LABs. The numbers of buses, GH lines, wires, and numbers of other components may also vary depending on the implementation.

In FIG. 4, a plurality of LABs is programmably coupled to a global interconnect structure, GHs 210. A portion of the LABs, represented by LAB 410, in the row may be designated for LAB output enable (OE) signal generation. LAB 410 is representative of a LAB that provides logic functions and signals for programmably coupling through GHs 210 and OE generation circuits 425 for controlling the enabled and disabled states of a plurality of tristate switches 423. Inputs to LAB 410 are programmably coupled to select lines 415 of GHs 210. Outputs of the LEs 300 of LAB 410 are programmably coupled through tristate drivers 417 to output enable (OE) lines 418, which is a portion of GHs 210.

A tristate driver 417 is a tristateable buffer. When enabled, tristate driver 417 drives a signal from LE 300 onto OE line 418. When disabled, the output of tristate driver 417 will be tristated. Tristate driver 417 may be programmably or logically controlled, or both. For example, when programmably controlled, tristate driver 417 will be enabled or disabled depending on the state of programmable cells. Programmable cells such as RAM, ROM, EPROM, EEPROM, SRAM, and antifuse, as well as other technologies, may be used.

Tristate driver 417 may also be logically controlled by way of logic signals from LEs and LABs (which may be programmably coupled through GHs 210). The logic signals will enable and disable the output of tristate driver 417. Furthermore, if tristate driver 417 is both programmably and logically controlled, tristate driver 417 output may be enabled when tristate driver 417 is both programmable and logically enabled. For example, when programmably disabled, tristate driver 417 decouples the LE output from OE lines 418. When programmably enabled, LEs and LABs may logically control the output state of tristate driver 417. Tristate driver 417 may buffer the signals from LAB 410 to OE lines 418. In some embodiments, tristate driver 417 may be implemented using other various types of tristate devices and structures including tristate buffers and tristate switches, among others. Tristate driver 417 is described in more detail below.

A portion of the LABs in the row may be designated as LAB sources, represented by LABs 420. Inputs to LAB 420 may be coupled to GHs 210. A portion of the outputs of LAB 420 may be coupled through tristate switches 423 to a dedicated tristate bus 403, which may be separate from GHs 210. For example, in FIG. 4, LAB 420 has eight LEs 300, four of which are coupled to tristate switches 423. LAB 420 is associated with an OR generation circuit 425. OE generation circuit 425 may or may not be integrated into LAB 420. OE generation circuit 425 is coupled to the control nodes of tristate switches 423 for controlling whether tristate switches 423 are enabled or disabled. Tristate switch 423 may be individually and independently controlled. When enabled, tristate switch 423 couples LEs 300 to tristate bus 403. When disabled, tristate switch 423 decouples LEs 300 from tristate bus 403.

Tristate switch 423 may be implemented using pass gates, drivers, buffers, logic gates, and other circuit configurations, and combinations of these. Tristate switch 423 may be implemented using other types of tristate devices and structures including tristate drivers and buffers. The specific implementation depends on factors such as the loading on tristate bus 403. For example, when tristate bus 403 is relatively heavily loaded, tristate switches 423 may be implemented using tristate drivers in order to reasonably and adequately drive the load. On the other hand, tristate bus 403 is often less heavily loaded than GHs 210. Consequently, as shown in FIG. 4, tristate switch 423 may be implemented using a pass gate. A pass gate implementation may provide improved transient performance since there will be fewer gate delays in the speed path.

Tristate switch 423 has a control electrode coupled to OE generation circuit 425. Logic signals from OE lines 418 of global interconnect structure are programmably coupled to OE generation circuit 425 to control the whether tristate switches 423 are enabled or disabled. For example, a logic signal from LAB 410 may be programmably coupled through the global interconnect to logically control one or more tristate switches 423. The logic signal will control whether these tristate switches 423 will couple one or more LEs 300 of a LAB 420 to tristate bus 403. Specifically, when OE generation circuit 425 provides a logic high, tristate switch 423 couples LE 300 to tristate bus 403. When OE generation circuit 425 provides a logic low, tristate switch 423 decouples LE 300 from tristate bus 403. Moreover, the output state of tristate switch 423 may also be programmably controlled similar to the case of tristate driver 417, described above.

From the tristate bus, signals may be driven to the global interconnect, other logic elements, LABs, and other circuits on the integrated circuit. This feature provides a programmable logic architecture with greater functionality and flexibility. For example, logic signals may be dynamically coupled to circuits and conductors as determined by the logic. This may be used to create a dynamically reconfigurable programmable logic device, where signal pathways are reconfigurable as needed, without reprogramming the integrated circuit. Further, a plurality of logic elements may be multiplexed on tristate bus 403. In a preferred embodiment, since GHs 210 are typically heavily loaded and have relatively long runs, signals from tristate bus 403 may be driven through a tristate driver 417 onto data bus lines 427 of the GHs 210.

A portion of the LABs in the row may be designated as LAB destinations, represented by LAB 430. LAB 430 is representative of the LABs which may be coupled to source LABs 420. More specifically, for example, inputs of LABs 430 may be programmably coupled to data bus lines 427 (of GHs 210). LAB 430 outputs may also be programmably coupled (not shown) to the global interconnect. The architecture of the present invention provides various paths between the LABs and LEs. For example, logic in LAB 410 may couple outputs from LEs 300 in source LAB 420 to tristate bus 403. From tristate driver 403, the outputs from LE 300 may be further coupled through tristate driver 417 and through data bus 427 to destination LAB 430. Source LABs 420 may be coupled to destination LABs 430 in different rows by programmably coupling through the global interconnect. For example, GHs 427 may be coupled through GVs (not shown) to LABs in other rows.

For implementing the tristate architecture of the present invention, the present scheme includes tristate bus 403 and additional control wires for the tristate control. The blocks of logic that need to communicate via tristate bus 403 are grouped together as source LABs 420. The outputs of LABs 420 are fed through tristate switches 423 onto tristate bus 403. Tristate switches 423 may be controlled by separate control wires from OE generation circuits 425. Tristate bus 403 may not directly feed into destination LABs 430. Instead, tristate bus 403 may be coupled through tristate drivers 417 and the global interconnect to destination LABs 430. This scheme implements relatively fast, high-performance tristate structures (especially when compared to programmable multiplexers). Programmable multiplexers are relatively slow since there is some overhead and complexity associated with the programmable cells and their accompanying circuits.

Figure 5A:
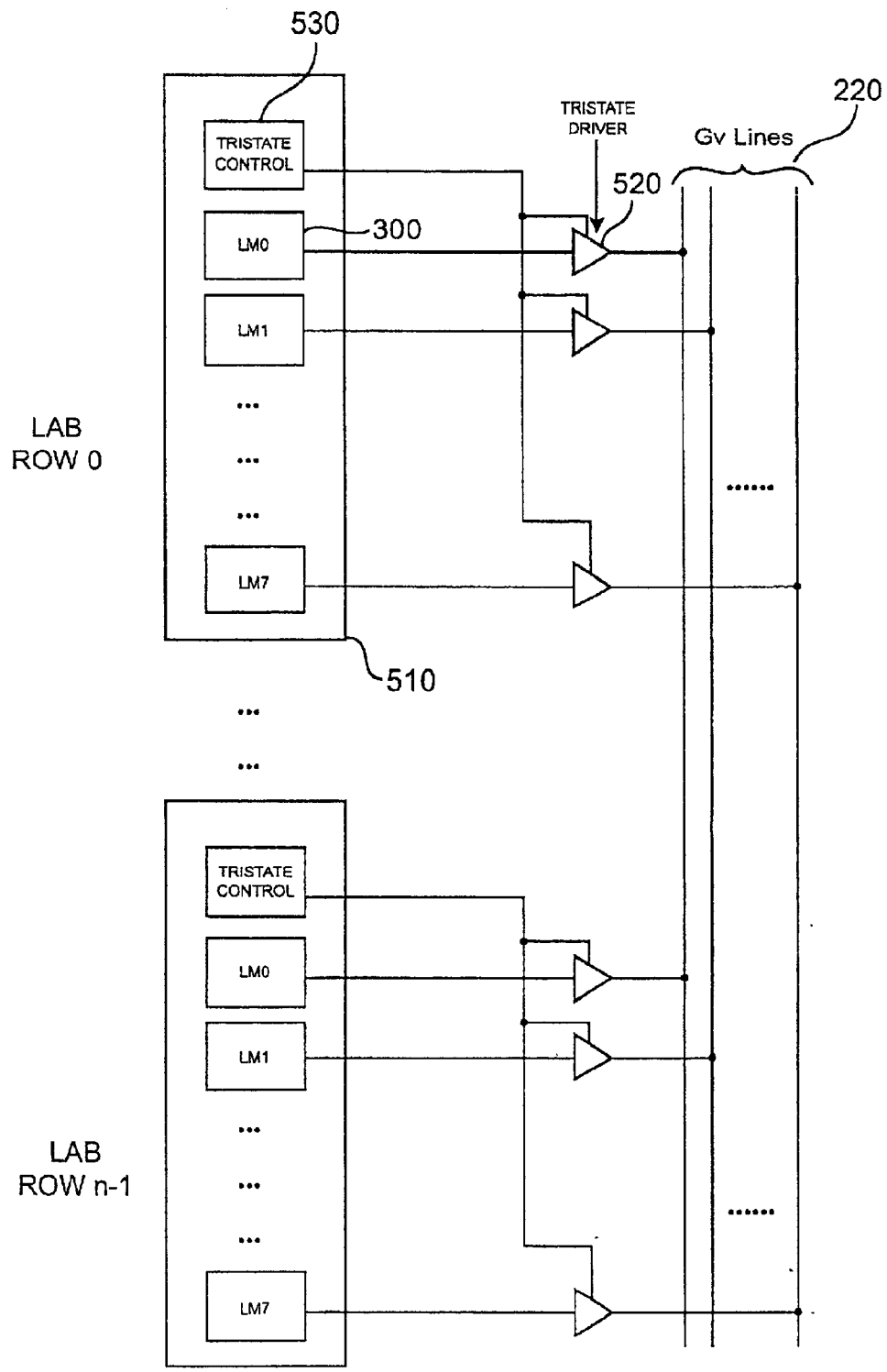
FIGS. 5A–B are more detailed block diagrams of further embodiments of the tristate architecture of the present invention.

FIG. 5A is a block diagram of another embodiment of the tristate architecture of the present invention. In particular, FIG. 5A shows a column of LABs 510 coupled through tristate drivers 520 to GVs 220. In this embodiment, GHs may be directly programmably coupled to the inputs of the LABs. GVs may not be directly programmably coupled to the inputs of the LABs. However, GVs may be programmably coupled through the GHs to the inputs of the LABs. The architecture of the present invention may also be similarly applied to a column of LABs.

The particular embodiment shown in FIG. 5A is for purposes of illustrating the present invention. The numbers of the particular elements, as well as the interconnections for these elements, may vary depending on the specific implementation of the present invention. For example, even though a specific number of LABs are shown, there may be any number of LABs in a row of the present invention. There may be various numbers LEs within the LABs. The numbers of buses, GH lines, wires, and numbers of other components may also vary depending on the implementation.

In FIGS. 5A, LEs 300 are coupled through tristate drivers 520 to GVs 220. Since global interconnect conductors are typically heavily loaded and extend relatively long distances, tristate drivers 520 generally buffer the outputs of LEs 300. However, in cases of less heavy loading, tristate drivers 520 may be implemented using other types of tristate devices and structures including tristate switches and other similar circuits.

Tristate drivers 520, associated with a particular LAB 510, are controlled by a tristate control 530 of that LAB 510. Tristate control 530 controls whether tristate drivers 520 are enabled or disabled. When enabled, tristate drivers 520 couple LEs 300 to GVs 200. When disabled, tristate driver 520 decouple LEs 300 from GVs 200. Tristate control 530 can control tristate drivers 520 separately and individually. Signals on GVs 220 may be programmably coupled to tristate control 530 for controlling the enabled and disabled states of tristate drivers 520.

Tristate drivers 520 may be logically or programmably controlled, or both, as discussed above. For example, tristate driver 520 may be programmably enabled by way of programmable cells. These programmable cells may be incorporated within tristate control 530 or tristate driver 520. Tristate driver 520 may also be controlled by way of logic signals from LEs and LABs programmably coupled (not shown) through the programmable and global interconnect and tristate control 530.

LEs 300 are coupled through tristate drivers 520 to GVs 220 for coupling to other LABs 510 and LEs 300. These LABs and LEs may be in the same or different column and in the same or different row. Moreover, GVs 220 contain a plurality of conductors. LABs 510 may be coupled to the plurality of GVs 220 in an organized fashion or "pattern." For example, a first LE 300 of LAB 510 in a first row is coupled a first GV 220 of the plurality. A first LE 300 of LAB 510 in a second row is coupled to the first GV 220. A first LE 300 of LABs 510 in subsequent rows are similarly coupled to the first GV 220. The second LEs 300 of LABs 510 are coupled to a second GV 220 of the plurality. The third LEs 300 of LABs 510 are coupled to a third GV 220 of the plurality, and so forth for subsequent LEs 300 in LABs 510. LABs 510 and LEs 300 may also be coupled to the GVs 220 in other formats, organizations, and patterns.

In the tristate architecture of the present invention, by coupling the LEs 300 through tristate drivers 520 to GVs 220 in an organized fashion, many different function may be performed. For example, tristate control 530 may control tristate drivers 520 so that one GV 220 line is multiplexed between the multiple LEs 300 coupled to that GV 220 line. In particular, signals from multiple LEs may be simultaneously coupled to and transferred using the same programmable interconnect line. The multiplexing operation may be implemented using multiplexing protocols such as time multiplexing, frequency multiplexing, and others. Further, the connections and configuration of logic elements may be dynamically reconfigured, without the need to reprogram programmable cells. Generally, the architecture of the present invention allows for greater utilization of the global and programmable interconnect, as well as greater overall utilization of the logic element resources.

Figure 5B:
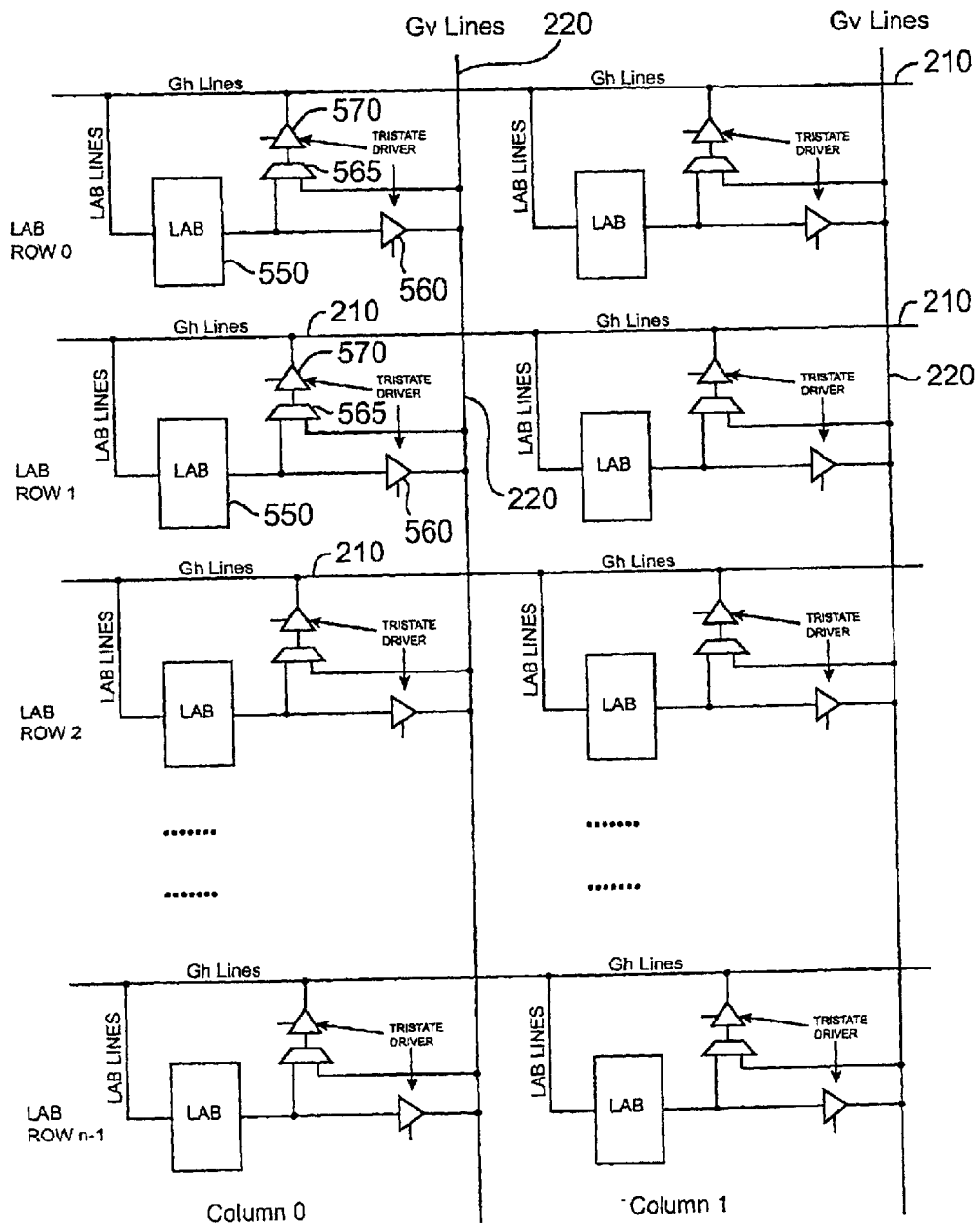

FIG. 5B is a block diagram of a further embodiment of the present invention. This embodiment is similar to the embodiment in FIG. 5A, and provides further tristate structure interconnection paths. FIG. 5B illustrates the routing structure for LABs 550 and tristate drivers 560 and 570 to the GVs 220 and GHs 210. In order keep the drawing simple, many specific details are not shown. For example, tristate drivers 560 are shown. However, these tristate drivers 560 may represent a plurality of tristate drivers such as a tristate driver for each LE (not shown) in LAB 550. Moreover, multiplexers 565 may represent a plurality of multiplexers, one for each LE (not shown) in LAB 550.

In this embodiment, similar to that shown in FIG. 5A, for a column of LABs 550, LABs are coupled through tristate drivers 560 to a plurality of GVs 220. FIG. 5B shows two columns and multiple rows of LABs 550. A PLD may have any number of rows and columns of LABs.

LABs 550 in a column may be coupled to GVs 220 in a similar manner as shown FIG. 5A. In particular, tristate drivers 560 may be coupled to GVs 220 in an organized fashion or "pattern" like that shown in FIG. 5A. More specifically, for example, as in FIG. 5A, LEs in a first position (not shown) in LABs 550 may be coupled to a first GV 220. LEs in a second position (not shown) in LABs 550 may be coupled to a second GV 220, and so forth. The tristate drivers may be programmably or logically controlled as discussed earlier.

In FIG. 5B, a multiplexer 565 is associated with LAB 550. Multiplexer 565 selectively couples GVs 220 or LAB 550 through tristate driver 570 to GHs 210. In a first state, multiplexer 565 couples LAB 550 (and its LEs) to GHs 220. In a second state, multiplexer 565 couples GVs 220 to GHs 210. Tristate driver 570 is generally similar to tristate driver 560.

Multiplexers 565 may be programmably or logically controlled. For example, multiplexer 565 may be programmably controlled by way of a programmable memory cell. Multiplexer 565 may also be logically controlled by a logic signal from LABs, LEs, GVs, GHs, and other similar sources.

The architecture of the present invention allows greater flexibility in the connectivity of the logic blocks in a PLD. For example, a LAB may be coupled through multiplexer 565 and tristate driver 570 to GHs 210. These interconnections may be made in a very similar organized fashion to the interconnections between LABs 550 and GVs 220 in FIG. 5A. Therefore, through multiplexer 565 and tristate driver 570, LABs in a row may be coupled via GHs 210 to LABs in the same row (but, possibly different column).

Moreover, multiplexer 565 may be configured to allow signals on GVs 210 to be coupled to GHs 220. Then, these signals may be routed along GHs 210 to other rows and columns. In particular, a LAB may output a signal through tristate driver 560 to GVs 220. This signal may be routed along GVs 220 to GHs 210 for the same or different row through a multiplexer 565 and tristate driver 570 for that row. Then, this signal may be input to the LABs in any column of that row via GHs 210. Using this technique, a signal may be routed from a particular location to another location in the same or different row and the same or different column.

The present invention provides for a generalized, flexible interconnection scheme using tristate structures. LABs in one location may be coupled to LABs in other locations, possibly in different rows and columns. The tristate structures allow the global interconnections to be logically or programmably controlled. The interconnections may also be multiplexed. Furthermore, if a particular path between two LABs is being used, another route can typically be utilized. Therefore, the structure is extremely flexible and permits greater overall utilization of the logic elements on the integrated circuit.

Figure 6:
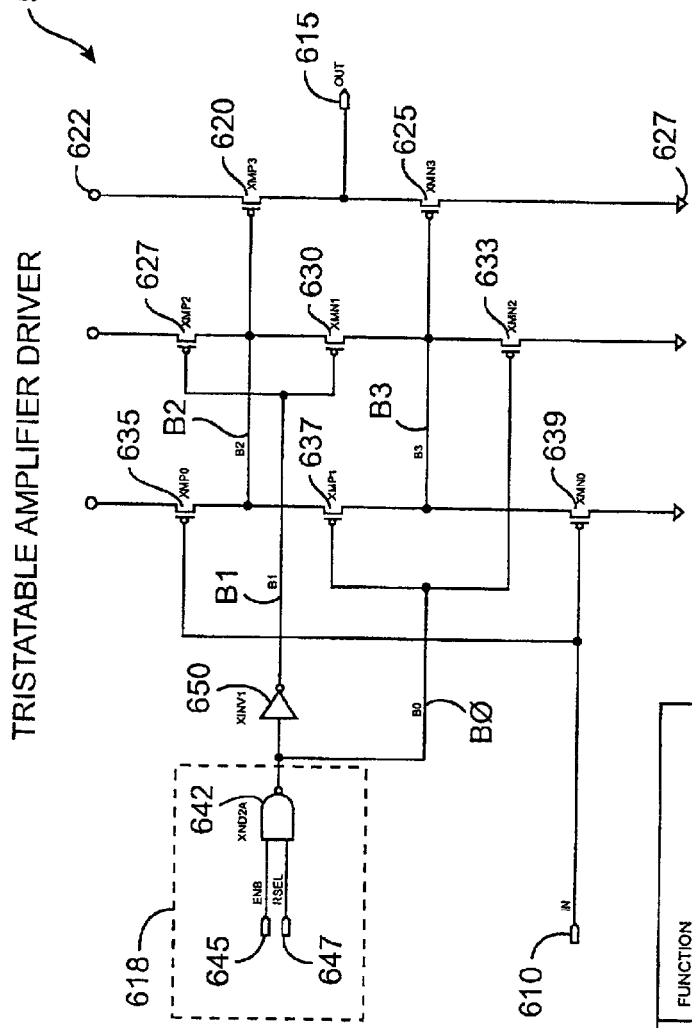
FIG. 6 is a schematic of a tristate driver of the present invention.

FIG. 6 is a schematic of a tristate driver circuit of the present invention. This tristate driver may be used in the tristate architectures shown in FIGS. 4 and 5A–B, such as tristate driver 520. However, other tristate driver circuits may also be used to implement the tristate architecture of the present invention. Generally, when enabled and driving, the tristate driver of FIG. 6 buffers an input signal provided at an input line 610 and outputs this signal to an output line 615. When disabled or tristated, or both, the output line 615 of the tristate driver is in a high-impedance or tristate mode. Depending on the layout and other considerations, portions of the circuitry shown in FIG. 6 may be implemented as part of other circuitry such as tristate control 530 (or OE generation circuit 425). For example, in order to provide for a more compact layout, the logic circuitry shown in box 618 may be included in tristate control 530, rather than tristate driver 520.

A transistor 620 is coupled between a first potential source 622 and output line 615. A control electrode of transistor 620 is coupled to a node B2. First potential source 622 is typically the VCC of the integrated circuit, although a local VCC may also be used. A transistor 625 is coupled between output line 615 and a second potential source 627. The second potential source 627 is generally at a voltage below that of first potential source 622. Second potential source is typically about VSS. A control electrode of transistor 625 is coupled a node B3. Transistors 620 and 625 may be referred to as a driver transistors. In a preferred embodiment, transistor 620 is PMOS and transistor 625 is NMOS.

A transistor 627 is coupled between first potential source 622 and node B2. A control electrode of transistor 627 is coupled to a node B1. A transistor 630 is coupled between node B2 and node B3. A control electrode of transistor 630 is coupled to node B1. A transistor 633 is coupled between node B3 and second potential source 627. A control electrode of transistor 633 is coupled to a node B0. Transistors 627, 630, and 633 may form a first predriver. In a preferred embodiment, transistor 627 is PMOS and transistors 630 and 633 are NMOS.

A transistor 635 is coupled between first potential source 622 and node B2. A control electrode of transistor 635 is coupled to input line 610. A transistor 637 is coupled between node B2 and node B3. A control electrode of transistor 637 is coupled to a node B0. A transistor 639 is coupled between node B3 and second potential source 627. A control electrode of transistor 639 is coupled to input line 610. Transistors 635, 637, 639 may form a second predriver. In a preferred embodiment, transistor 635 and 637 are PMOS and transistor 639 is NMOS.

A NAND gate 642 generates an output at node B0 based on an enable (ENB) input 645 and an RSEL input 647. An inverse of the output of NAND gate 642 is generated at node B1 by an inverter 650.

ENB input 645 and RSEL input 647 control the operation of the tristate driver. RSEL input 647 is typically programmably controlled. For example, this input may be coupled to a programmable memory cell (riot shown), which may be implemented using RAM, SRAM, ROM, EPROM, and EEPROM technologies, to name a few. When RSEL is a logic low, the tristate driver will be disabled, and output line 615 will be tristated. The tristate driver will be tristated regardless of the states of ENB input 645 and input line 610.

When RSEL is a logic high, the tristate driver will be enabled. However, the state of output line 615 depends on ENB 645. ENB 645 is typically logically controlled. For example, in a programmable logic device, ENB may be coupled to a signal from a logic element or local or global interconnect conductor. When ENB is a logic low (and RSEL is a logic high), output line 615 will be tristated. When ENB is a logic high (and RSEL is a logic high), the tristate driver is enabled and driving; an input signal on input line 610 will be driven onto output line 615.

The tristate driver of the present invention may be used in many applications. These applications include, for example, an output driver or an internal bus driver. Further, in an embodiment, the tristate driver of the present invention provides programmable and logical controls. Specifically, programmable control, RSEL input 647, allows the tristate driver to be disabled, regardless of the states of the logical inputs. When programmably enabled, the output state tristate driver is logically controlled by ENB input 645. ENB input 645 may be used to dynamically couple and decouple signals to a programmable interconnect bus when needed. Furthermore, the tristate driver of the present invention provides buffering of the signal to the programmable interconnect bus, which may be heavily loaded, since this conductor (e.g., GHs and GVs) may drive long distances and to many inputs of many logic elements.

In operation, when the tristate driver is enabled and driving, node B0 will be a logic low and node B1 will be a logic high. Transistor 637 is on and transistor 633 is off. Transistor 627 is off and transistor 630 is on. When input line 610 is a logic low, transistor 639 is off and transistor 635 is on. Then, node B3 will be a logic high, node B2 will be a logic high. Transistor 620 will be turned off and transistor 625 will be turned on. Output line 615 will be a logic low.

On the other hand, when input line 610 is a logic high, transistor 635 is off, and transistor 639 is on. Then, node B3 will be a logic low. Node B2 will be a logic low (i.e., by a conductive path through transistor 630). Transistor 620 will be turned on and transistor 625 will be turned off. Output line 615 will be a logic high.

In the cases when ENB 645 is a logic low or RSEL 647 is a logic low, or both are logic low, node B0 will be a logic high, and node B1 will be a logic low. Transistor 637 is off and transistor 633 is on. Transistor 627 will be on and transistor 630 will be off. Regardless of the logic state at input line 610, node B2 will be a logic high and node B3 will be a logic low. Then, transistor 620 is a turned off and transistor 625 is turned off. Output line 615 will be tristate, or in a high impedance state.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A method of multiplexing signals onto an interconnect line comprising:

enabling a first tristate driver having first and second driver transistors, an input coupled to a first logic element and an output directly connected to the interconnect line, such that a first signal is driven from the first logic element onto the interconnect line using the first tristate driver;

dynamically tristating the first tristate driver; and dynamically enabling a second tristate driver having third and fourth driver transistors, an input coupled to a second logic element and an output directly connected to the interconnect line, such that a second signal is driven from the second logic element onto the interconnect line using the second tristate driver, wherein the first tristate driver is dynamically tristated using a third logic element.

2. The method of claim 1 further comprising:

dynamically tristating the second tristate driver.

3. The method of claim 1 wherein the first tristate driver is dynamically tristated without reconfiguring a memory cell.

4. The method of claim 3 wherein the second tristate driver is dynamically enabled without reconfiguring a memory cell.

5. The method of claim 1 wherein the first tristate driver is dynamically tristated using a first tristate control circuit.

6. The method of claim 5 wherein the second tristate driver is dynamically enabled using a second tristate control circuit.

7. The method of claim 1 wherein the second tristate driver is dynamically enabled using a fourth logic element.

8. The method of claim 1 wherein the first tristate driver is dynamically tristated without writing to a memory cell.

9. A programmable logic integrated circuit comprising:

a first programmable interconnect bus;

a first plurality of logic elements configurable to perform logical functions;

a plurality of tristate devices coupled between the first plurality of logic elements and the first programmable interconnect bus;

a dedicated tristate device having an input coupled to the first programmable interconnect bus;

a second programmable interconnect bus coupled to an output of the dedicated tristate device;

a second plurality of logic elements configurable to perform logical functions and coupled to the second programmable interconnect bus;

a plurality of programmable memory cells coupled to the plurality of tristate devices to programmably enable and programmably tristate the plurality of tristate devices; and tristate control logic having outputs coupled only to the plurality of the devices to dynamically enable and dynamically tristate the plurality of tristate devices.

10. The integrated circuit of claim 9 wherein the tristate control logic is programmably coupled to signals on the programmable interconnect bus for controlling the states of the plurality of tristate devices.

11. The integrated circuit of claim 9 wherein one of the plurality of logic elements is coupled through one of the plurality of tristate devices through the programmable interconnect bus to another one of the plurality of logic elements.

12. The integrated circuit of claim 9 wherein the tristate control logic comprises a logic element.

13. A programmable logic integrated circuit comprising:

a first logic element having a first output;

a first tristate driver having a first enable input, a second enable input, a second output, and a first input coupled to the first output;

a first programmable memory cell coupled to the first enable input;

a second logic element coupled to the second enable input;

a third logic element having a third output;

a second tristate driver having a third enable input, a fourth output, and a second input coupled to the third output;

a second programmable memory cell coupled to the third enable input; and an interconnect line coupled to the second output and the fourth output;

wherein the interconnect line is not coupled to the second input and the fourth output by a programmable connection, and the second logic element dynamically tristates and dynamically enables the first tristate driver.

14. The integrated circuit of claim 13 wherein the interconnect line is a vertical conductor.

15. The integrated circuit of claim 13 wherein the interconnect line is in a tristate bus.

16. An integrated circuit comprising:

a first logic element having an output;

a first tristate driver having an input coupled to the output of the first logic element, ad an output;

a second logic element having an output;

a second tristate driver having an input coupled to the output of the second logic element, and an output;

a first interconnect bus coupled to the output of the fine tristate driver and coupled to the output of the second tristate driver;

a second interconnect bus;

a third tristate driver having an input coupled to the first interconnect bus and an output coupled to the second interconnect bus;

third and fourth logic elements having inputs coupled to the second interconnect bus;

wherein the first tristate driver, the second tristate driver, and the third tristate driver are dynamically tristated and enabled.

17. The integrated circuit of claim 16 wherein the first tristate driver is dynamically tristated without writing to a memory cell.

18. A programmable logic integrated circuit comprising:

a tristate driver coupled between a first logic element that is configurable to implement combinatorial functions and a first interconnect line;

an output enable generation circuit coupled to te first interconnect line; and a tristate switch coupled between a second logic element that is configurable to implement combinatorial fictions and a second interconnect line, wherein a control input of the tristate switch is coupled to the output enable generation circuit.

19. The integrated circuit of claim 18 wherein the tristate driver and the tristate switch are dynamically tristated and enabled.

20. The integrated circuit of claim 19 wherein the tristate driver and the tristate switch are dynamically tristated without writing to a memory cell.

* * * * *